(12) United States Patent (10) Patent No.: US 9,103,536 B2
Sachsenweger et al. (45) Date of Patent: Aug. 11, 2015

(54) ASSEMBLY HAVING A SEMICONDUCTOR LIGHT SOURCE AND SUPPORT FOR A PRINTED CIRCUIT BOARD, AND METHOD FOR MOUNTING THE ASSEMBLY

(75) Inventors: Peter Sachsenweger, Zeitlarn (DE); Yuli Chen, Shenzhen (CN); Zhenjian Liang, Shenzhen (CN); Xuefeng Wang, Shenzhen (CN); Junhua Zeng, Shenzhen (CN)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 13/816,421

(22) PCT Filed: Aug. 9, 2011

(86) PCT No.: PCT/EP2011/063680
§ 371 (c)(1),
(2), (4) Date: Feb. 11, 2013

(87) PCT Pub. No.: WO2012/020013
PCT Pub. Date: Feb. 16, 2012

(65) Prior Publication Data
US 2013/0141913 A1 Jun. 6, 2013

(30) Foreign Application Priority Data

Aug. 10, 2010 (CN) .......................... 2010 1 0257403
Aug. 10, 2010 (DE) .......................... 10 2010 039 120

(51) Int. Cl.
*F21V 21/002* (2006.01)
*F21V 19/00* (2006.01)
*F21V 29/00* (2015.01)
(Continued)

(52) U.S. Cl.
CPC ................ *F21V 21/002* (2013.01); *F21K 9/13*
(2013.01); *F21V 19/003* (2013.01); *F21V 29/004* (2013.01); *F21V 29/74* (2015.01); *H05K 3/0061* (2013.01); *H05K 3/325* (2013.01); *F21S 2/005* (2013.01); *F21V 23/02* (2013.01); *F21Y 2101/02* (2013.01); *F21Y 2103/022* (2013.01); *F21Y 2105/001* (2013.01); *H05K 1/181* (2013.01); *H05K 2201/09027* (2013.01);
(Continued)

(58) Field of Classification Search
CPC .. F21Y 2101/02; F21V 19/0055; F21K 9/135
USPC ............ 362/373, 645, 249.02, 364, 365, 294
See application file for complete search history.

(56) References Cited

U.S. PATENT DOCUMENTS 8,395,058 B2 * 3/2013 Gibson et al. ................ 174/267
2008/0093998 A1 4/2008 Dennery et al.
2011/0261572 A1 * 10/2011 Watanabe et al. ............. 362/373

FOREIGN PATENT DOCUMENTS

JP 2003 068129 3/2003
WO WO 2008/123670 10/2008
WO WO 2010/061746 6/2010

OTHER PUBLICATIONS

Isoda et al, Japanese Patent Application Publication 2003-068129, Jul. 2003, machine translation.*

*Primary Examiner* — Tracie Y Green
(74) *Attorney, Agent, or Firm* — Cozen O'Connor

(57) ABSTRACT

A printed circuit board (1), having a front side (2) for population with at least one semiconductor light source (4) and having at least one securing element (6) accessible via a rear side (3), wherein the at least one securing element (6) is embodied as an electrical through-conduction element for at least one of the semiconductor light sources.

24 Claims, 11 Drawing Sheets

(51) Int. Cl.
  *H05K 3/00* (2006.01)
  *H05K 3/32* (2006.01)
  *F21K 99/00* (2010.01)
  *F21V 29/74* (2015.01)
  *F21S 2/00* (2006.01)
  *F21V 23/02* (2006.01)
  *F21Y 101/02* (2006.01)
  *F21Y 103/02* (2006.01)
  *F21Y 105/00* (2006.01)
  *H05K 1/18* (2006.01)

(52) U.S. Cl.
  CPC .............. *H05K 2201/10106* (2013.01); *H05K 2201/10303* (2013.01); *Y10T 29/49117* (2015.01)

ASSEMBLY HAVING A SEMICONDUCTOR LIGHT SOURCE AND SUPPORT FOR A PRINTED CIRCUIT BOARD, AND METHOD FOR MOUNTING THE ASSEMBLY

RELATED APPLICATIONS

This is a U.S. National Phase Application under 35 USC 371 of International Application PCT/EP2011/063680 filed on Aug. 9, 2011.

This application claims the priority of Chinese application no. 201010257403.6 filed Aug. 10, 2010 and German application no. 10 2010 039 120.4 filed Aug. 10, 2010, the entire content of both of which are hereby incorporated by reference.

FIELD OF THE INVENTION

The invention relates to a printed circuit board designed for being equipped with at least one semiconductor light source. The invention furthermore relates to a support for the printed circuit board. The invention also relates to a system comprising the printed circuit board and the support. The invention additionally relates to a method for securing the printed circuit board to the support.

BACKGROUND OF THE INVENTION

FIG. 9 shows in a view obliquely from above a printed circuit board 101, which is populated on its front side 102 and is not populated on its rear side 103. The front side is populated in a central region with a plurality of light emitting diodes 104 and, around the light emitting diodes 104, with a plurality of, also different, electronic components 105. The electronic components 105 may have been applied to the front side 102 by means of reflow soldering, for example. Moreover, a plug connection element 106 is secured to an edge region of the front side 102, and in a manner oriented toward the outside. By means of the plug connection element 106, the electrically operable elements on the front side 102 (light emitting diodes 104 and electronic components 105) can be supplied with a current or a voltage. For this purpose, the front side is provided with a conductor track or conduction structure (not shown) which electrically connects the electrically operable elements 104, 105 to one another and to the plug connection element 106.

The printed circuit board 101, for the securing thereof, is placed and screwed by its rear side 103 onto a support, e.g. a heat sink. Before that, a ring cover 108 is placed thereon as is explained in greater detail with reference to FIG. 2. For the screw connection, the printed circuit board 101 here has two screw bushings 107.

FIG. 10 shows in a view obliquely from above the printed circuit board 101 with a ring-shaped ring cover 108 covering the electronic components 105. The printed circuit board 101 and the ring cover 108 can also be designated as an LED module. An inner wall 109 of the ring cover 108 serves as a reflector wall for the light emitting diodes 104. The ring cover 108 likewise has two screw holes 110, such that two screws 111 can respectively be led through the screw holes 110, 107 and be screwed to the support. The tightened screws press the ring cover 108 in a sealing fashion onto the front side 102 of the printed circuit board 101 and the printed circuit board 101 by its rear side 103 onto the support.

For electrical contact-making, the ring cover additionally has a lateral insertion opening 112, through which the plug connection element 106 is accessible and through which e.g. a matching mating plug connection element can be inserted.

The printed circuit board 101 shown has the disadvantage that, for the lateral electrical contact-making, it is necessary to provide a corresponding volume alongside the printed circuit board 101 or the ring cover 108 for accommodating the external mating plug connection element and for cable routing. Moreover, the plug connection element 106 considerably increases a structural height. On the printed circuit board 101, area occupancy is also impaired by the provision of the screw holes 107. Furthermore, the screws 111 bring about a disadvantageous appearance in plan view.

Incandescent-lamp retrofit lamps are known which have a heat sink into which a driver cavity is integrated. A printed circuit board populated with at least one light emitting diode is mounted on a front-side support area of the heat sink. The driver cavity is closed off toward the rear by a base, via which a driver situated in the driver cavity can be connected to a power supply voltage. The outputs of the driver are electrically connected to the at least one light emitting diode in order to supply the light emitting diode with a suitable current or voltage signal. For this purpose, the heat sink contains a cutout in the form of a bushing between the driver cavity and the support area, through which appropriate cables can be led. In order to secure the printed circuit board to the heat sink, the printed circuit board is laterally clamped into the heat sink, screwed to the heat sink or adhesively bonded to the heat sink.

What is disadvantageous in the case of such an incandescent-lamp retrofit lamp is that the wiring can be implemented only in a comparatively complex fashion, e.g. owing to insertion and soldering of the cables. Moreover, securing the printed circuit board to the heat sink is comparatively complex, e.g. as a result of a necessary provision of screws and tool in the case of a screw connection and as a result of a comparatively small size of the screws (e.g. M3 or M4).

SUMMARY OF THE INVENTION

It is an object of the present invention at least partly to eliminate known disadvantages of semiconductor lighting devices, in particular of semiconductor lighting devices as described above, and in particular to provide a semiconductor lighting device, in particular semiconductor lamp, which can be mounted particularly simply.

It is another object of the present invention at least partly to eliminate disadvantages of printed circuit boards populated with semiconductor light sources and/or disadvantages of the printed circuit board described and in particular to provide a printed circuit board having a small structural height which can be secured in a particularly space-saving manner.

This object is achieved in accordance with the features of the independent claims. Preferred embodiments can be gathered, in particular, from the dependent claims.

These and other objects are attained in accordance with one aspect of the present invention directed to a printed circuit board, having a front side for population with at least one semiconductor light source and having at least one securing element accessible via a rear side, wherein the at least one securing element is embodied as an electrical through-conduction element for at least one of the semiconductor light sources.

The rear side can have, in particular, at least one securing element. Consequently, the printed circuit board can have a front side for population with at least one semiconductor light source and a rear side with at least one securing element, wherein the at least one securing element is embodied as an electrical through-conduction element for at least one of the semiconductor light sources.

The front side of the printed circuit board can have a corresponding conductor track structure for population with the at least one semiconductor light source. The conductor track structure can have contact areas for securing the at least one semiconductor light source. The conductor track structure can furthermore be designed to be populated with at least one electronic component (resistors, capacitors and/or integrated circuits, etc., e.g. using a surface mounting technology (SMT)) and can also have corresponding contact areas for this purpose.

In one configuration, moreover, at least one electrically conductive securing element is led through the printed circuit board. Thus, an area, e.g. front side or top side, of the at least one securing element, said area being accessible from the front side of the printed circuit board, can be used as a contact area, e.g. for connection to a conductor track, as a contact area for a wire connection ("wire bond pad") or as an SMD surface.

Consequently, the at least one securing element which also serves as the electrical through-conduction element may, in particular, be electrically connected to at least one contact area of the front side of the printed circuit board or constitute such a contact area.

The securing element serving as the electrical through-conduction element can be, in particular, an electrical conduction element, that is to say itself be electrically conductive at least in regions, and consequently constitute part of the electrical path to the semiconductor light source. The securing element can, in particular, be electrically connected to a conductor track structure.

Alternatively, the securing element serving as the electrical through-conduction element itself need not be an electrical conduction element, and therefore need not itself be electrically conductive, but it has to permit a through-conduction of an electrical line provided by a matching mating securing element.

In one configuration, moreover, the printed circuit board has a plurality of securing elements arranged, in particular, symmetrically with respect to an axis of symmetry of the printed circuit board, in particular rotationally symmetrically, circularly symmetrically or angularly symmetrically. The printed circuit board can have, in particular, two securing elements.

The securing elements can be arranged, in particular, point-circularly, to be precise e.g. in one row or in a plurality of rows, but can, for example, also be arranged radially.

In one development, in particular, the printed circuit board is provided with a plurality of securing elements, in particular two thereof, in the form of continuous cutouts, in particular keyholes. The keyholes can be provided in each case with a soldering region in particular on the front side of the printed circuit board, said soldering region being situated in particular at the web region, in particular at an end of the keyhole remote from an eye region. The soldering region can be electrically connected to the conductor track structure.

In one configuration, furthermore, the printed circuit board has a plurality of securing elements configured and/or arranged in a coded fashion. It is thereby possible to ensure that the securing elements are correctly connected.

In one development, the securing elements have an identical form for a coding, but are arranged in a coded fashion at the rear side of the printed circuit board. One possible coded arrangement is, for example, a non-angularly symmetrical arrangement or distribution. One possible non-angularly symmetrical arrangement may be, for example, a point-circular or sectorwise point-circular arrangement, wherein at least one additional securing element is present outside the point-circular arrangement, e.g. in a manner offset inward (in the direction of the axis of symmetry or longitudinal axis).

In another development, at least one securing element from a group of a plurality of securing elements has a different form with respect to the other securing elements of the group. By way of example, said at least one securing element can have a form which does not fit into an associated cutout for the other securing elements of the group, e.g. by virtue of the fact that it is made significantly wider or longer.

These two types of coding can also be combined.

In another configuration the at least one securing element in each case has a securing region to which a matching mating securing element can be secured in a force-locking manner, in a positively locking manner and/or cohesively. In one configuration, for example, the securing element has a clamp at its securing region. However, the securing element can have any suitable latching element at its securing region.

In one specific configuration for securing an engaging mating securing element, the securing region is configured as a soldering region which is arranged on the front side and which comprises soldering material. The soldering region can be provided for the purpose that a mating securing element present there is soldered to the printed circuit board or to the securing element, e.g. by means of reflow soldering. The soldering region can be precoated in particular (before the printed circuit board is secured to the support) with a soldering material, which facilitates soldering.

In one particularly preferred alternative, the soldering material of the soldering region can be provided as a ductile contact material having good electrical conductivity for reliably making electrical contact with the mating securing element, to be precise without soldering.

The soldering material can be in particular a tin/lead mixture, in particular a tin/lead layer in accordance with the ASTM International Standard B579-73 (2004) "Standard Specification for Electrodeposited Coatings of Tin-Lead Alloy" (so-called "Solder Plate").

The securing region can be designed to secure or hold the mating securing element in a releasable or non-releasable fashion.

The securing region can be, in particular, electrically connected to a conductor track structure.

The front side of the printed circuit board can be populated, in particular, with the at least one semiconductor light source and/or with the at least one electronic component.

The printed circuit board can comprise a base material (substrate) composed of ceramic. The printed circuit board can furthermore comprise a conventional base material, such as FR4. The printed circuit board may be embodied, moreover, as a metal-core printed circuit board (MCPCB) or the like in order to achieve improved heat spreading.

This printed circuit board affords the advantage that the mechanical connection or securing and the electrical connection are integrated with one another and connection elements can thus be saved. Moreover, a particularly compact design is achieved by means of the rear-side mechanical and electrical connection, for example by virtue of lateral electrical contact-making being obviated and an assembly height being reduced, since the electrical plug used hitherto is often the highest component mounted on the conventional printed circuit board. Moreover, separate securing elements such as screws, etc. can be dispensed with, which reduces a mounting outlay. As a result of the securing at the rear, moreover, at the front side a better area utilization can be made possible and also an improved appearance owing to the fact that it is no longer necessary to arrange the separate securing elements on the front side. In addition, a number of supply leads can be set in a simple manner by the number of securing elements serving as electrical through-conduction elements. A large number of securing elements can also be arranged at the rear side of the printed circuit board without enlarging the design.

The rear side of the printed circuit board can serve, in particular, as a support area. On account of its comparatively large area, good heat dissipation from the at least one semiconductor light source is thus made possible through the rear side.

Preferably, the at least one semiconductor light source comprises at least one light emitting diode. If a plurality of light emitting diodes are present, they can emit light in the same color or in different colors. A color can be monochromatic (e.g. red, green, blue, etc., or multichromatic (e.g. white). The light emitted by the at least one light emitting diode can also be an infrared light (IR LED), or an ultraviolet light (UV LED). A plurality of light emitting diodes can generate a mixed light; e.g. a white mixed light. The at least one light emitting diode can contain at least one wavelength-converting phosphor (conversion LED). The at least one light emitting diode can be present in the form of at least one individually housed light emitting diode or in the form of at least one LED chip. A plurality of LED chips can be mounted on a common substrate ("submount"). The at least one light emitting diode can be equipped with at least one dedicated and/or common optical unit for beam guiding, e.g. at least one Fresnel lens, collimator, and so on. Instead of or in addition to inorganic light emitting diodes, e.g. based on InGaN or AlInGaP, organic LEDs (OLEDs, e.g. polymer OLEDs) can generally be used as well. Alternatively, the at least one semiconductor light source can have e.g. at least one diode laser.

In one configuration, the printed circuit board has a rear side with at least one securing element. The printed circuit board then has, in particular, a front side for population with at least one semiconductor light source and a rear side with at least one securing element, wherein the at least one securing element is embodied as an electrical through-conduction element, in particular conduction element.

In a further configuration, the at least one securing element comprises at least one electrically conductive securing element projecting from the rear side.

In another configuration, the at least one securing element comprises at least one electrically conductive securing pin projecting from the rear side. Such a securing pin can be inserted particularly simply into a matching cutout of the support. Moreover, a securing pin can also be secured to the printed circuit board particularly simply, e.g. by means of reflow soldering, for particularly simple securing also in a reflow process with other elements to be secured to the printed circuit board by means of a reflow process.

The at least one securing pin may project or protrude, in particular, perpendicularly from the rear side of the printed circuit board. The at least one securing pin may have a cylindrical, in particular circular-cylindrical, basic form. In another development, the at least one securing pin has a laterally widened free end or a (particularly circumferential) recess, such that it can be held particularly simply in particular in a positively locking manner in a receptacle. The at least one securing pin may be embodied in particular in a manner shaped identically or similar in form to a GU pin (a pin of a plug of a GU connection, as known e.g. for halogen lamps).

However, the printed circuit board is not restricted to a configuration of the at least one securing element in the form of a securing pin. Thus, the at least one securing element may, for example, also be present as a hook, in particular latching hook, a lug, in particular latching lug, etc.

Alternatively or additionally, the at least one securing element can be embodied as at least one receptacle or cutout for receiving a projecting mating securing element of the support. The at least one receptacle can be configured, in particular, as a respective perforation through the printed circuit board, that is to say in the form of a cutout led through the printed circuit board. As a result, matching projecting mating securing elements, e.g. securing pins, can be led from the rear side through the at least one securing element, as a result of which the at least one mating securing element is accessible from the front side of the printed circuit board and can be electrically contact-connected in a simple manner to the at least one semiconductor light source or the electrical contact zone(s) thereof. Thus, an area of the at least one mating securing element which is accessible from the front side of the printed circuit board can be used as a contact area, e.g. for connection to a conductor track, and also as a contact area for a wire connection ("wire bond pad") or as an SMD surface.

In another configuration, the at least one securing element is present in the form of a keyhole. The keyhole makes possible reliable, at least positively locking, preferably positively locking and force-locking, securing by means of a particularly simple plugging/rotating movement. Moreover, the keyhole can be introduced particularly simply. The securing region of the keyhole can, in particular, be present at a web region or correspond to the web region.

However, the at least one securing element can also have a cutout in a different form, e.g. in the form of a plug-in hole.

Alternatively or additionally, the at least one securing element can comprise at least one electrically conductive securing element projecting from the rear side.

Another aspect of the invention is directed to a support, in particular for a printed circuit board as described above, wherein the support has at least one support area for at least indirect (direct or indirect) emplacement of the printed circuit board, wherein at least one mating securing element for securing a securing element of the printed circuit board is arranged on the support area, and wherein at least one mating securing element is embodied as an electrical through-conduction element.

The support makes possible the same advantages as already described for the printed circuit board. The support can, moreover, be embodied in a particularly simple manner.

Another aspect of the invention is directed to a support, in particular for a printed circuit board as described above, wherein the printed circuit board has at least one support area for at least indirect (direct or indirect) emplacement of the printed circuit board, wherein at least one mating securing element for securing a securing element of the printed circuit board is arranged on the support area, and wherein at least one mating securing element is an electrically conductive mating securing element which is functionally/electrically connected to at least one electrical supply (e.g. a power supply connection, if appropriate via a driver). The support can therefore mechanically hold and make electrical contact with the printed circuit board by means of the same mating securing element. The support makes possible the same advantages as already described for the printed circuit board. The support can, moreover, be embodied in a particularly simple manner.

In one configuration, at least one mating securing element is configured as an electrical conduction element and for this purpose is itself electrically conductive at least in sections. Consequently, the mating securing element constitutes part of the electrical path to the printed circuit board or the at least one semiconductor light source. The support can thus mechanically hold and make electrical contact with the printed circuit board.

In one configuration, the mating securing element is then connected, in particular, to at least one electrical supply.

Alternatively, the mating securing element can be configured as a through-conduction element which itself is not electrically conductive, but can permit through-conduction of an electrical line provided by a matching securing element. By way of example, the mating securing element can be a cutout in a basically electrically insulating printed circuit board, e.g. composed of FR4, through which a matching electrically conductive pin is led, wherein an electrical wiring takes place only at the pin and not at the cutout.

In one configuration, the at least one mating securing element is present in each case in the form of a cutout for receiving a projecting securing element of the printed circuit board. The cutout is consequently embodied such that, upon engagement by the associated securing element of the printed circuit board, said cutout mechanically (in a force-locking manner, cohesively and/or in a positively locking manner, holds and, in particular, makes electrical contact with said element.

Alternatively or additionally, if the at least one securing element of the printed circuit board can comprise a cutout, the at least one mating securing element can also be present as a projection, e.g. securing pin.

In one configuration, the at least one mating securing element is present in the form of a keyhole. Thus, the securing element, in particular if it has a pin-like configuration, can be held on the support by means of a simple plugging/rotating movement reliably at least in a positively locking manner, preferably in a positively locking and force-locking manner.

However, the at least one mating securing element can also have a different form, e.g. in the form of a plug-in hole.

In one configuration, furthermore, the at least one mating securing element has at least one, in particular resilient, latching means for, in particular releasably latching an inserted securing element. The at least one mating securing element can generally be configured for releasable or non-releasable latching. For the case where the at least one mating securing element is present in the form of a keyhole, an open clamp can be arranged e.g. below the web region of the keyhole, into which clamp a securing pin can be latched.

In one development, the latching means of at least one mating securing element is connected to the electrical supply.

The support can be embodied, in particular, as a heat sink or as part of a heat sink. The heat sink can be a dedicated heat sink. However, the heat sink can e.g. also be part of a luminaire. However, the support can also be any other suitable object, e.g. a driver housing.

In one configuration, the at least one mating securing element is configured as a projection. In one specific configuration, the at least one mating securing element comprises at least one electrically conductive securing pin projecting from the support area. The at least one mating securing element preferably comprises two electrically conductive securing pins. The support can be in particular a housing, in particular driver housing. The driver housing can also be connected to a base, in particular closed off thereby. The driver housing can have, in particular, the at least one mating securing element and the base at opposite ends, e.g. at opposite end faces if the housing is configured in cylindrical, in particular circular-cylindrical, fashion.

A driver accommodated in the driver housing can have a driver circuit board, on which the mating securing elements, in particular securing pins, are mounted. The mating securing elements can then be led, for example, through a wall of the driver housing.

Another aspect of the invention is directed to a system comprising the printed circuit board as described above and the support as described above, wherein the printed circuit board is at least indirectly fixed to the support by virtue of the at least one securing element of the printed circuit board engaging in a positively locking manner, cohesively and/or in a force-locking manner into a respectively matching mating securing element of the support, or vice versa. This makes possible the advantages already described above.

In the system, the supply (for example a current or voltage supply, e.g. a driver) is electrically connected via the mating securing element and, if appropriate, the associated securing element at least to a contact area of the front side of the printed circuit board if the front side is already populated, and also electrically connected to the at least one semiconductor source.

In particular, the rear side of the printed circuit board can bear a really on the support area of the support, which allows effective heat dissipation from the front side of the printed circuit board.

In a configuration that is particularly advantageous for heat dissipation from the front side of the printed circuit board, a thermally conductive layer is introduced between the printed circuit board and the support. The thermally conductive layer can comprise e.g. a thermal interface material (TIM), e.g. a thermally conductive adhesive, a thermally conductive paste, a thermally conductive film, a thermally conductive pad, etc. If the thermally conductive layer comprises a solid material, e.g. the thermally conductive film or the thermally conductive pad, the thermally conductive layer can have a cutout at the position of the at least one securing element or mating securing element, in order not to impede a connection of these two elements. The thermally conductive layer can thus have at least one cutout for leading through the securing element and/or the mating securing element.

The layer having good thermal conductivity is preferably elastically compliant in a thickness direction, such that this layer can also serve as a spring element which makes possible a height compensation or length compensation and a force-locking securing of the printed circuit board to the support.

In another configuration, a heat sink introduced between the printed circuit board and the support (in particular in the case of a housing, in particular driver housing), wherein the heat sink has at least one cutout for leading through the securing element and/or the mating securing element. The heat sink can thus be secured to the system by means of a simple plugging movement.

In one development, the heat sink is at least partly plugged over the support. As a result, the heat sink can be securely fixed and, moreover, achieve effective cooling of the support, in particular of the driver housing.

In another development, the printed circuit board is arranged on a receptacle of the heat sink. Effective lateral positional fixing of the printed circuit board and good heat transfer between the printed circuit board and the heat sink are made possible as a result. In particular, the printed circuit board can bear with its rear side areally on the heat sink, in particular in the receptacle thereof, in order to achieve a large heat transmission area.

In one development, furthermore, the system has at least one fixing element for fixing a position, in particular rotational position, of the printed circuit board. The fixing element can prevent, in particular, a rotation relative to the heat sink and/or the support, in order thus to prevent, in particular, the printed circuit boards from inadvertently being released/ rotating back after a rotating movement of the printed circuit board has previously been effected for the securing thereof.

The system can constitute, in particular, a lamp or a part of a lamp. The printed circuit board, if appropriate together with other elements that are secured or can be secured thereto, can be configured as a luminous module. The support can also be a luminaire or a part thereof.

Another aspect of the invention is directed to a method for securing a printed circuit board as described above to a support as described above, wherein the at least one mating securing element of the support is inserted by means of a plugging movement or a plugging/rotating movement into a matching securing element of the printed circuit board in a force-locking and/or positively locking manner. Such securing can be effected, in particular, without tools.

The plugging/rotating movement can be carried out, for example, by plugging at least one securing pin (of the printed circuit board and/or of the support) into a respective eye region of a matching keyhole (of the support and/or of the printed circuit board) and subsequently rotating the at least one securing pin into the web region of the keyhole. In the web region, the securing pin can be latched e.g. by a resilient clamp in particular in a releasable manner, thereby preventing the plugging/rotating movement from inadvertently being released.

The plugging movement can be carried out, for example, by plugging at least one securing element (of the printed circuit board and/or of the support) into a respective hole, in particular elongated hole (of the support and/or of the printed circuit board). In the hole, the securing element can be latched e.g. in a releasable or non-releasable manner, thereby preventing the plugging movement inadvertently being released.

Another aspect of the invention is directed to a method for at least indirectly securing a printed circuit board populated with at least one semiconductor light source (in particular light emitting diode) to a support (in particular driver housing), wherein the method comprises at least the following steps:

plugging a heat sink onto the support such that at least one electrically conductive securing pin which projects from the support and which is connected to an electrical supply projects through the heat sink, placing the printed circuit board onto the heat sink such that the at least one securing pin projecting through the heat sink projects at least partly into an associated cutout (in particular keyhole) of the printed circuit board, securing the at least one securing pin in the associated cutout, such that at least one securing pin is electrically connected to at least one semiconductor light source.

In one configuration, the step of placing the printed circuit board onto the heat sink is preceded by a step of: applying a thermal layer, in particular solid thermal layer, to the heat sink.

In another configuration:
the at least one cutout is present in the form of a keyhole,
securing the at least one securing pin in the associated keyhole is carried out by means of a rotating movement between the support and the printed circuit board, and
a step of fixing a relative rotational position between the support and the printed circuit board is additionally carried out by means of a fixing element.

BRIEF DESCRIPTION OF THE DRAWINGS

In the following figures, the invention is described schematically in greater detail on the basis of an exemplary embodiment. In this case, for the sake of clarity, identical or identically acting elements may be provided with identical reference signs.

DETAILED DESCRIPTION OF THE DRAWINGS

Figure 1:
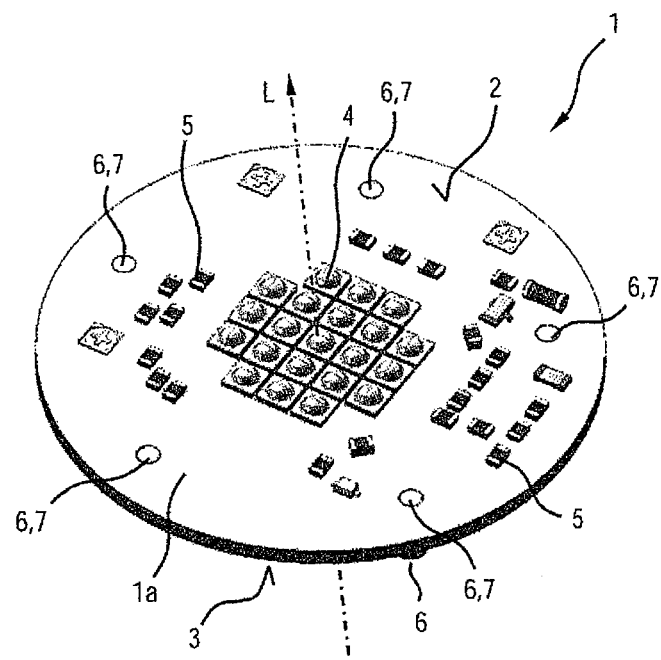
FIG. 1 shows a printed circuit board according to the invention in a view obliquely from above.
Figure 2:
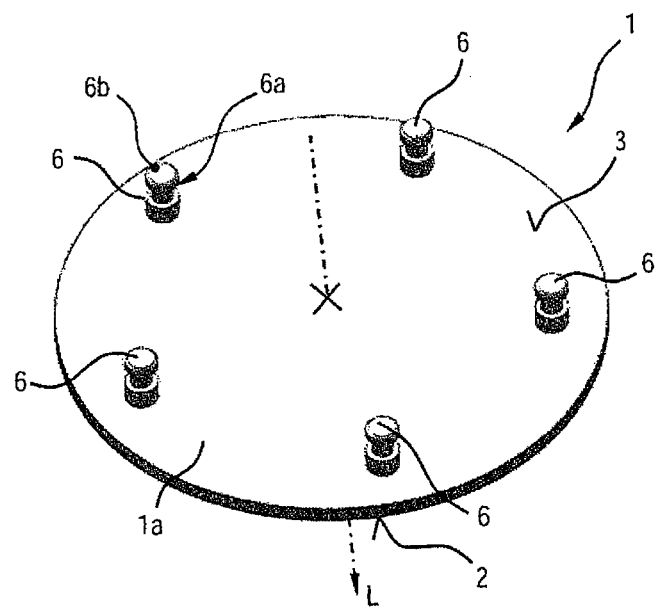
FIG. 2 shows the printed circuit board according to the invention in a view obliquely from below.
Figure 3:
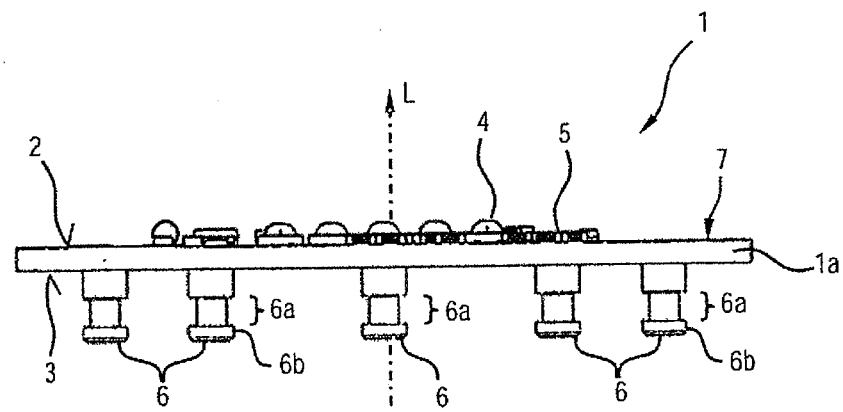
FIG. 3 shows the printed circuit board according to the invention in a side view.

FIG. 1 shows, in a view obliquely from above, a printed circuit board 1 having a circular basic body or substrate 1a. FIG. 2 shows the printed circuit board obliquely from below. FIG. 3 shows the printed circuit board 1 in a side view.

The front side 2 of the printed circuit board 1 or of the substrate 1a is populated here, too, by way of example in a central region with a plurality of light emitting diodes and, around the light emitting diodes 4, with a plurality of, also different, electronic components 5. For this purpose, the front side 2 is provided with a conductor track or conduction structure (not shown) which electrically connects the electrically operable elements 4, 5 to one another. However, the plug connection element 106 is now absent.

In return, by way of example five securing elements in the form of perpendicular metallic pins 6 are arranged on the rear side 3 circularly symmetrically with respect to a longitudinal axis L. The metallic pins 6 are led through the printed circuit board 1 or through the substrate 1a, their front-side surface 7 being areally flush with the front side 2 of the substrate 1a.

The surface 7 of the pins 6 can be electrically connected to the conductor track structure or directly to one of the electronic components 5 or one of the light emitting diodes 4, e.g. by means of soldering, wire bonding, etc. Consequently, by means of the pins 6, firstly an electrical connection between the front side 2, in particular the light emitting diodes 4, and the rear side 3 is produced (the pins 6 thus act as plated-through holes). The pins 6 serve as electrical pin contacts in the rearward direction. Secondly, the pins 6 serve as mechanical securing elements. The light emitting diodes 4 can be correspondingly operated by means of a suitable electrical allocation of the pins 6.

The pins 6 have at their rearwardly projecting section a recess 6a extending circumferentially in a ring-shaped fashion, in particular a ring groove, which is introduced into the otherwise circular-cylindrical form of the pins 6. The recess 6a allows a free end region 6b of the pin to project laterally beyond the recess 6a. The free end region 6b can be used for at least positively locking, in particular also force-locking, securing.

Since the plug connection element 106 is omitted, the printed circuit board 1 can be made flatter than the printed circuit board 101. Moreover, a screw bushing 107 is no longer required, which can improve an area utilization. As a result of the rear electrical contact-making unit furthermore, a space laterally with respect to the printed circuit board 1 can be better utilized. Moreover, a number of the pins 6 can be set in a simple manner. Even a large number of pins 6 can be arranged on the rear side 3 of the printed circuit board 1 without enlarging the design.

Figure 4:
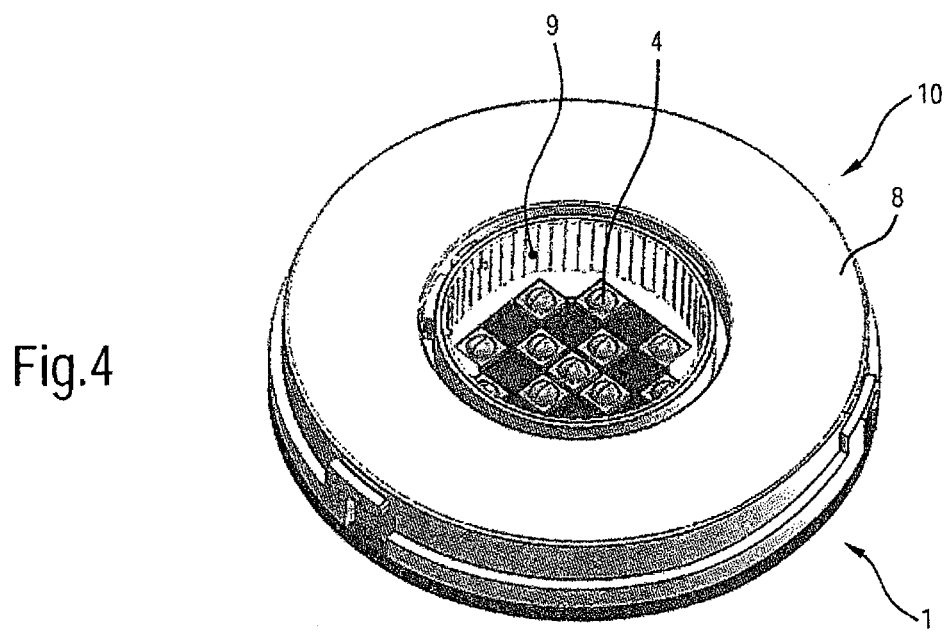
FIG. 4 shows, in a view obliquely from above, the printed circuit board according to the invention now covered with a cover on the front side.

FIG. 4 shows, in a view obliquely from above, an LED module 10 comprising the printed circuit board 1 and a ring cover 8 at least partly covering the front side 2 of the printed circuit board 1. The ring cover 8 covers the electronic components 5, but leaves free a central cutout for the light emitting diodes 4. An inner wall 9 of the ring cover 8 serves as a reflector wall for the light emitting diodes 4.

The ring cover 8 now has neither screw holes nor securing screws, with the result that the surface of the ring cover 8 is smooth and thus advantageous from a design standpoint. The ring cover 8 can be adhesively bonded to the printed circuit board 1, for example.

Figure 5:
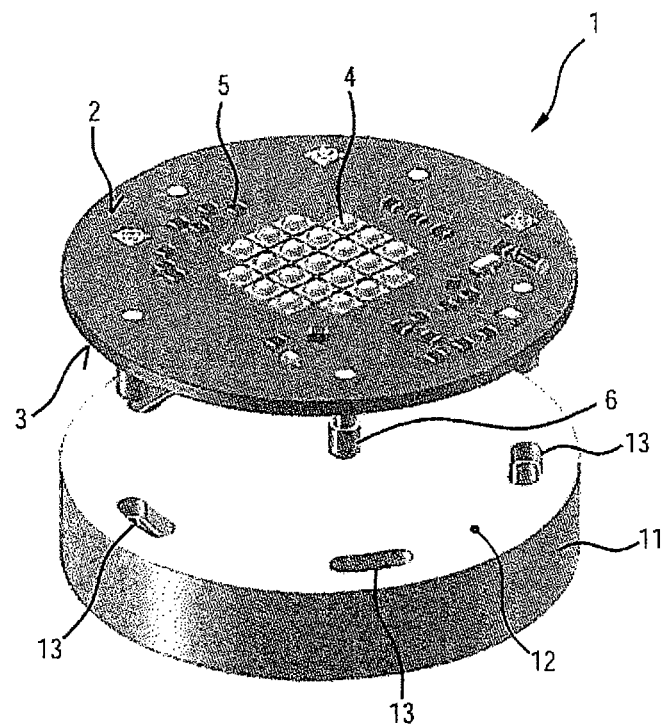
FIG. 5 shows, in a view obliquely from above, the printed circuit board according to the invention above a support according to the invention for the printed circuit board.
Figure 6:
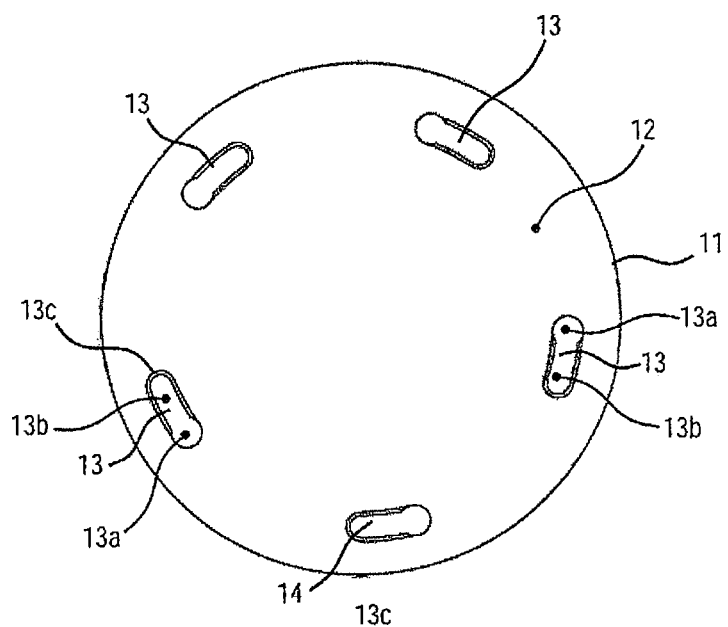
FIG. 6 shows the support according to the invention in a plan view of the support area thereof.

FIG. 5 shows, in a view obliquely from above, the printed circuit board 1 above a support 11 for the printed circuit board 1. FIG. 6 shows the support 11 in a plan view of said support's front-side support area 12 facing the printed circuit board 1. The support area 12 serves for supporting the rear side 3 of the printed circuit board 1, to be precise directly or indirectly, e.g. via an intermediate layer (not illustrated), in particular intermediate layer having a good thermal conductivity, such as a TIM.

The support 11, e.g. a dedicated heat sink, has five mating securing elements in the form of keyholes 13, which, in plan view, have the same arrangement as the pins 6. The pins 6 of the printed circuit board 1 can thus be inserted into a respective keyhole 13, wherein the rear side 3 then bears areally on the support area 12 and thus makes possible a low thermal contact resistance. The keyholes 13 are curved in a circumferential direction in order to make possible simple plugging/rotating securing.

An eye region 13a of the keyholes 13 is dimensioned for this purpose such that a pin 6 of the printed circuit board 1 can be inserted therein. The web region 13b adjacent to the eye region 13a is narrowed at a level corresponding to a position of the recess 6a of the pins 6, e.g. by means of laterally arranged longitudinal projections 13c. When the pins 6 are rotated into the associated web region 13b, they are retained by the longitudinal projections 13c in the direction of the longitudinal axis L at least in a positively locking manner in the keyhole 13.

Figure 7:
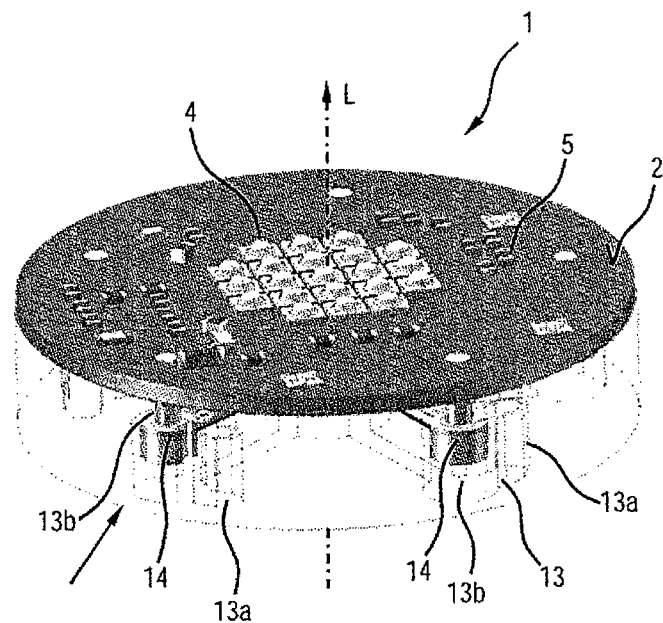
FIG. 7 shows, in a view obliquely from above, a system comprising the printed circuit board according to the invention and the support according to the invention in an assembled state, wherein the support is indicated as partly transparent.

FIG. 7 shows, in a view obliquely from above, a system comprising the printed circuit board 1 and the support 11 in an assembled state the support 11 being shown as partly transparent. In this case, instead of the printed circuit board 1, the LED module 10 can also be secured to the support 11.

The pins 6 have now been rotated into the associated web region 13b. An elastic clamp 14 open in the direction of the eye region 13a is situated in the respective web region 13b. When the pin 6 is rotated into the web region 13b, the pin 6 consequently latches in the clamp 14 and is held there with a press-on force. It is thereby possible to prevent the pin 6 from sliding out of the web region 13b back into the eye region 13a. This latching is releasable, and the pins 6 can be released from the clamps 14 by a sufficiently high rotating-back force. By virtue of the fact that the clamp 14 exerts the press-on force or pressure force on the pin 6, this also results in a good electrical contact between these two elements 6, 14.

Figure 8:
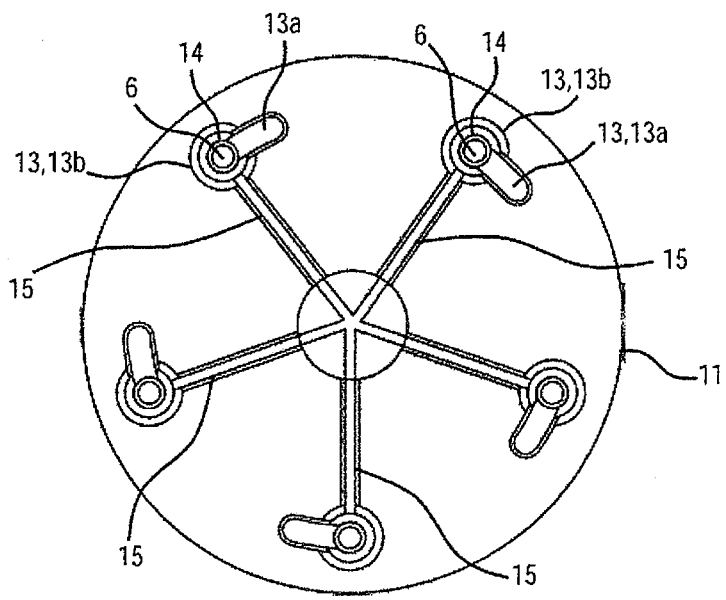
FIG. 8 shows the support according to the invention as a sectional illustration in plan view.
Figure 9:
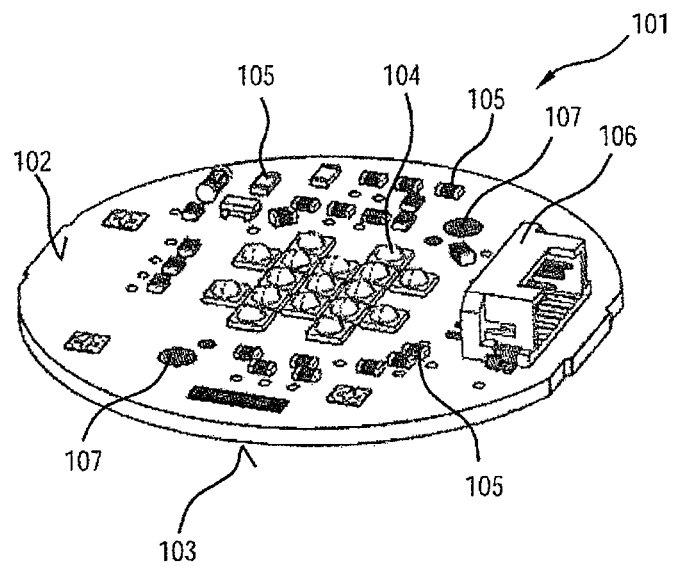
FIG. 9 shows in a view obliquely from above, a prior art circuit board.
Figure 10:
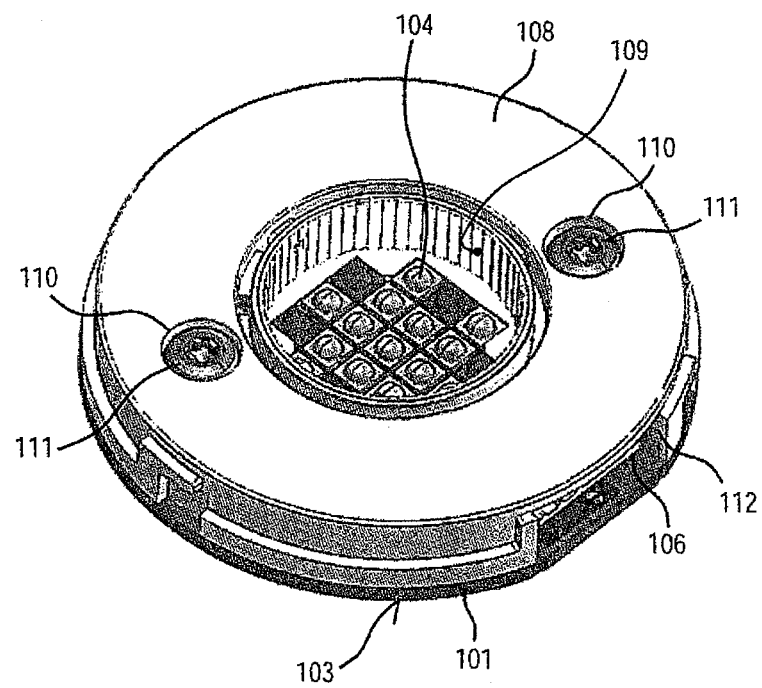
FIG. 10 shows the circuit board of FIG. 9, with a ring-shaped cover covering the electronic components.

FIG. 8 shows the support 11 as a sectional illustration in plan view. Each of the clamps 14 is jointly or individually electrically connected to an electrical supply, e.g. to an output of a driver or to a power supply system, via an electrical line 15. In the case shown, the electrical lines 15 run from the center of the support 11 to the clamps 14 in a star-shaped fashion.

Figure 11:
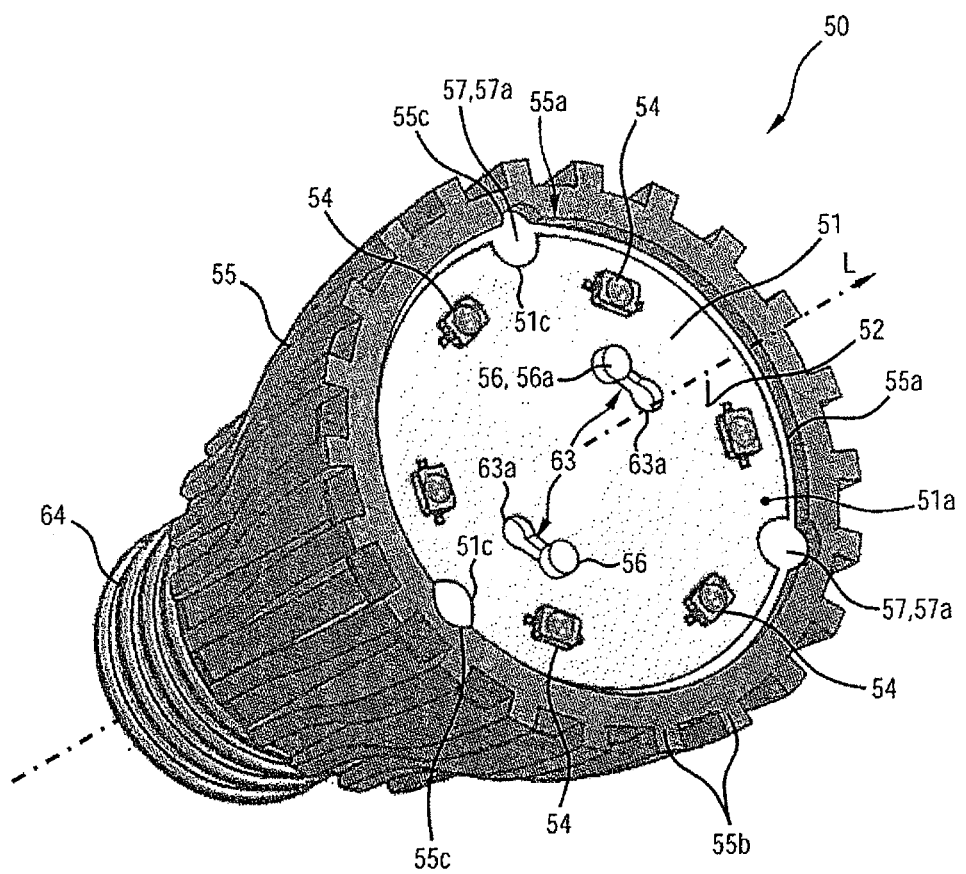
FIG. 11 shows a lighting device according to the invention in a view obliquely from above.

FIG. 11 shows a lighting device in the form of an LED incandescent-lamp retrofit lamp 50 in a view obliquely from above. A light emission of the lamp 50 is made possible by a presence of light emitting diodes 54 as the semiconductor light sources, which are oriented with their optical principal axis in the direction of an axis of symmetry or longitudinal axis L of the lamp 30. The light emitting diodes 54 thus emit substantially into a front or upper half-space. The light emitting diodes 54 are applied angularly symmetrically about the longitudinal axis L of the lamp 50 on a front side 52 of a circular-disk-shaped printed circuit board 51 or of a circular-disk-shaped substrate 51a of the printed circuit board 51. A conductor track structure (not illustrated) is situated on the front side of the printed circuit board 51 or of the substrate 51a and connects the light emitting diodes 54 to one another and/or to an electrical connection region on the printed circuit board 51.

An (in relation to the longitudinal direction L) upper side region or lateral surface of the lamp 50 is formed from a heat sink 55. The heat sink 55 has, as a receptacle 55a, an upper or front cutout, into which the printed circuit board 51 is inserted. The heat sink 55 can consist, in particular, of a highly thermally conductive material having a thermal conductivity λ of more than 15 W/(m·K), preferably where λ≥150 W/(m·K). The heat sink 55 may consist, in particular, of aluminum, copper or alloys thereof. On its outer lateral surface, the heat sink 55 has longitudinally directed or vertically oriented cooling ribs 55b arranged angularly symmetrically about the longitudinal axis L. Situated at a rear end of the lamp 50 is a base 64 for mechanically and electrically connecting the lamp 50 to an appropriate holder, for example a luminaire. The base 64 is embodied here purely by way of example as a screw base in the form of an Edison base.

The lamp 50 furthermore has, if the light emitting diodes 54 cannot be operated directly with the electrical signal that can be tapped off via the base 64, a driver (not illustrated), which typically converts the electrical signal that can be tapped off via the base 64 into an electrical signal (driver signal) provided for operating the light emitting diodes 54 and thus feeds the light emitting diodes 54. The driver, if appropriate together with the base 64, therefore constitutes the electrical supply of the light emitting diodes 54.

The printed circuit board 51 has two securing elements in the form of cutouts, specifically cutouts in the form of keyholes 63, said securing elements being introduced into the substrate 51a angularly symmetrically with respect to the longitudinal axis L. The keyholes 63 extend over the entire height of the substrate 51a, that is to say are introduced continuously into the printed circuit board 51 or the substrate 51a thereof. The printed circuit board 51 is secured to the lamp 50 by means of two securing pins 56 provided as matching mating securing elements, said securing pins engaging into the keyholes 63. If the printed circuit board 51 is configured as a metal-core printed circuit board, the keyholes 63 can be configured such that the metal core does not make contact with the securing pins 56. Alternatively, it may be that only the heads 56a of the securing pins 56, which are described in more detail further below, are electrically conductive on the outer side, but not their pin-like stems, which can be provided e.g. with an electrically non-conductive coating.

In order to prevent the printed circuit board 51 from being inadvertently released from the securing pins 56 on account of an undesired rotating movement of the printed circuit board 51 relative to the securing pins 56, the printed circuit board 51 and the heat sink 55 are fixed to one another by a fixing ring 57. The fixing ring 57 prevents a relative rotating movement of the printed circuit board 51 and of the heat sink 55, the securing pins 56 being rotationally invariant with respect to the heat sink 55. For this purpose, the fixing ring 57 has three widening regions 57a arranged angularly symmetrically, which engage into matching lateral recesses 51c of the printed circuit board and 55c of the heat sink 55.

An at least partly light-transmissive cover, e.g. a bulb (not illustrated; for example in the shape of a spherical cap), can curve above the printed circuit board 51. The bulb can be secured, for example, to a front side of the heat sink 55.

Figure 12:
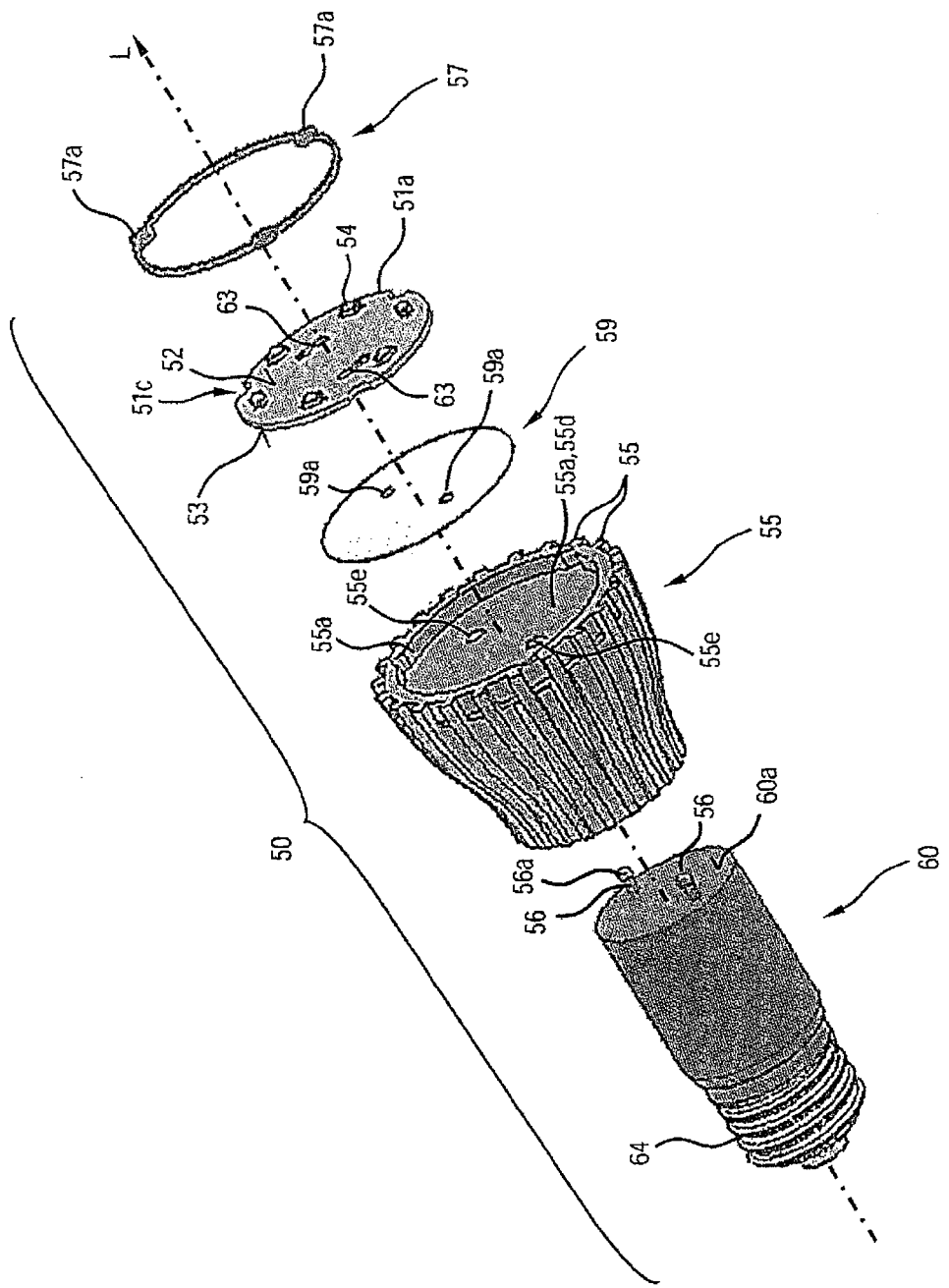
FIG. 12 shows, in an oblique view, the lighting device according to the invention in an exploded illustration.

FIG. 12 shows the lamp 50 in an exploded illustration. The lamp 50 may be assembled from just five, one-piece or multipartite, prefabricated elements. These elements comprise here: the fixing ring 57, the populated printed circuit board 51, an intermediate layer 59, the heat sink 55, and a driver housing 60 for receiving the driver (not illustrated). The driver housing 60 serves as the, here indirect, support for the printed circuit board 51. The driver housing 60 has a circular-cylindrical basic form. A front end face 60a of the driver housing bears the securing pins 56, while the rear end (the end oriented counter to the direction of the longitudinal axis L) is covered by the base 64.

The heat sink 55 has two circular bushings 55e in a bottom support area 55d of the receptacle 55a, through which bushings the securing pins 56 can be led without making contact with the heat sink 55.

The intermediate layer 59 consists of an elastic material and likewise has two bushings 59a, which are positioned congruently with respect to the bushings 55e of the heat sink 55 and the securing pins 56. The keyholes 63, in particular their eye regions 63a (see FIG. 16), in the printed circuit board 51 are in turn positioned congruently with respect thereto.

The intermediate layer 59 preferably consists of a material having good thermal conductivity, in particular a thermal interface material TIM.

In the course of assembling the individual elements 60, 55, 59, 51 and 57 by means of a linear movement in the orientation of the longitudinal axis L, the securing pins 56 are plugged through the matching bushing 55e, 59a and the eye regions 63a of the keyholes 63, as will be explained in more detail below.

Figure 13:
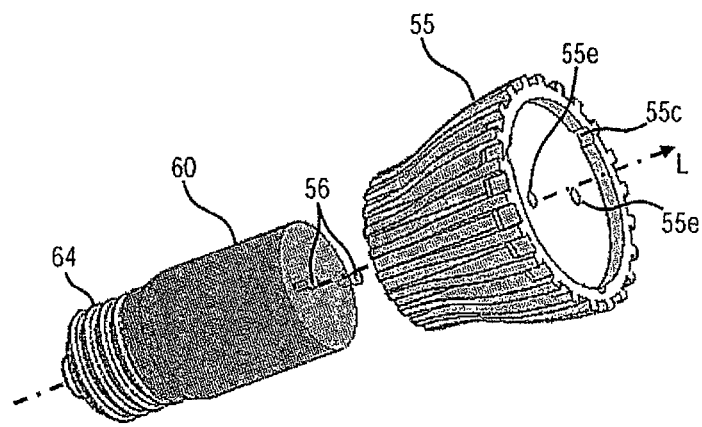
FIG. 13 shows a printed circuit board of the lighting device according to the invention in a view obliquely from above.
Figure 14:
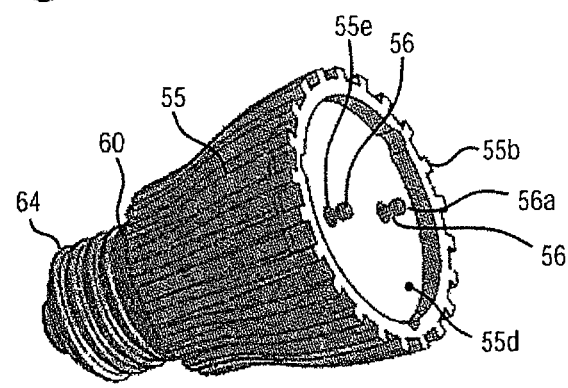
FIG. 14 shows, in a view obliquely from above, an exploded illustration of a driver housing and of a heat sink for the lighting device according to the invention.

In this respect, FIG. 13 firstly shows the driver housing 60 serving as the support with the heat sink 55. In a first mounting step, by way of example, the heat sink 55, having a rear circular-cylindrical cutout (not illustrated), can be placed onto the driver housing 60 by means of a movement along the longitudinal axis L. In other words, the driver housing 60 can be plugged into the rearwardly open cutout or receptacle of the heat sink 55, wherein the assembled or plugged-in state is shown in FIG. 14. In this case, the rear cutout of the heat sink 55 is dimensioned such that the driver housing 60 can be plugged into the cutout in particular with only a small gap or even also without a gap. This makes possible effective heat dissipation from the driver housing 60 to the heat sink 55 and thus effective cooling of the driver accommodated in the driver housing 60.

An interspace between the driver housing 60 and the heat sink 55 can be filled with a preferably liquid or pasty thermally conductive material (thermally conductive paste, thermally conductive adhesive, etc.) before or after assembly, in order to make possible even better heat conduction between the driver housing 60 and the heat sink 55.

Means can be provided for ensuring a relative angular position of the driver housing 60 relative to the heat sink 55 with respect to the longitudinal axis, for example vertical guide means or guide means oriented in the longitudinal direction, for example a guide ridge in one of the elements 55, 60 and a matching longitudinal groove in the other element 55 or 60, respectively. What can thereby be ensured is that the securing pins 56 in the mated or assembled state assume a sufficient distance from the heat sink 55. Alternatively, the bushings 55e can be lined with an electrical insulation material, e.g. a plastic sleeve.

Figure 15:
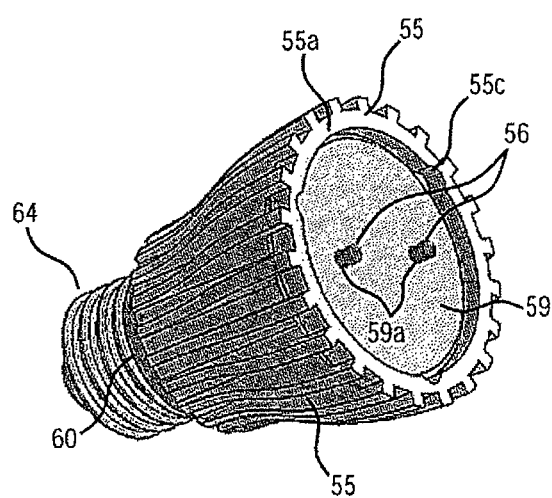
FIG. 15 shows, in an oblique view, the driver housing and the heat sink of the lighting device according to the invention in an assembled state.

FIG. 15 shows a further mounting step, in which, in addition to the state shown in FIG. 14, the intermediate layer 59 has been placed onto the support area 55d of the heat sink 55. The securing pins 56 project toward the front through the intermediate layer 59. The intermediate layer 59 can consist, in particular, of a material having a good thermal conductivity, in particular a TIM. The material of the intermediate layer 59 is furthermore preferably electrically insulating.

In a subsequent mounting step, the printed circuit board 51 is inserted onto the intermediate layer 59 into the receptacle 55a of the heat sink 55, as will be explained in more detail below.

Figure 16:
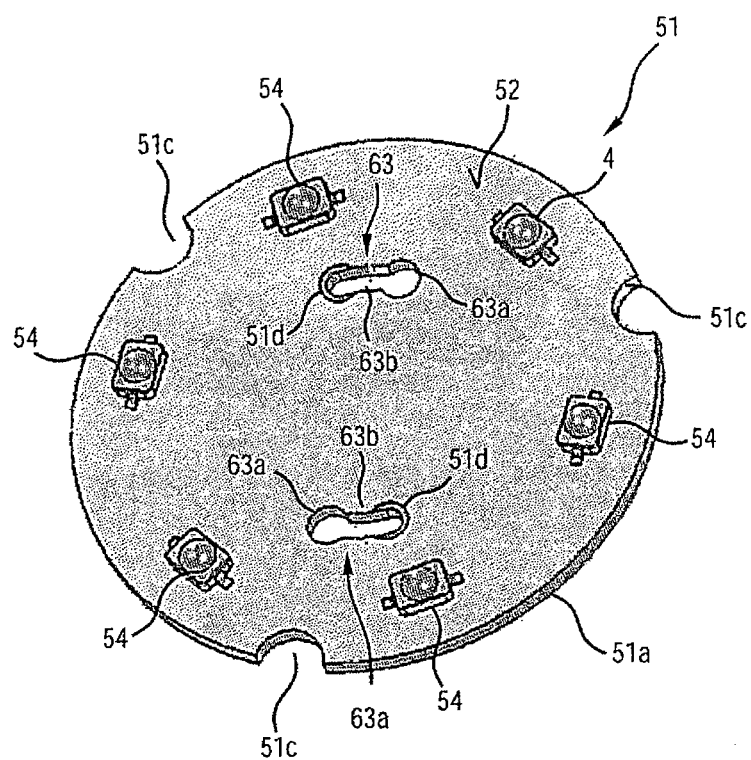
FIG. 16 shows, in an oblique view, the driver housing and the heat sink of the lighting device according to the invention in an assembled state with an additional thermal layer.

In this respect, FIG. 16 shows the front side 52 of the printed circuit board 51 in a more detailed illustration. The keyholes 63 each have an eye region 63a, through which a respective securing pin 56 can be plugged. Since the securing pin 56 has a lateral widening ("head") 56a at its free end, it is possible, by subsequently rotating the printed circuit board 51 with respect to the securing pins 56, to displace the respective securing pin 56 from the eye region 63a into a web region 63b of the keyhole 63. Since the web region 63b is made narrower than the eye region 63a, the printed circuit board 51 is held at least in a positively locking manner in longitudinal orientation L by the securing pins 56. At the ends of the web region 63b, a soldering region 51d is situated on the top side of the substrate 51 or of the printed circuit board 51 in a manner directly adjacent to the contour of the keyhole 63 as such. The soldering region 51d comprises a soldering material, in particular a layer thereof. The soldering material can be, in particular, a tin/lead mixture, and the soldering region 51 can comprise, in particular, a soldering material in accordance with the ASTM International-Standard B579-73 (2004) "Standard Specification for Electrodeposited Coatings of Tin-Lead Alloy" (so-called "Solder Plate").

Figure 17:
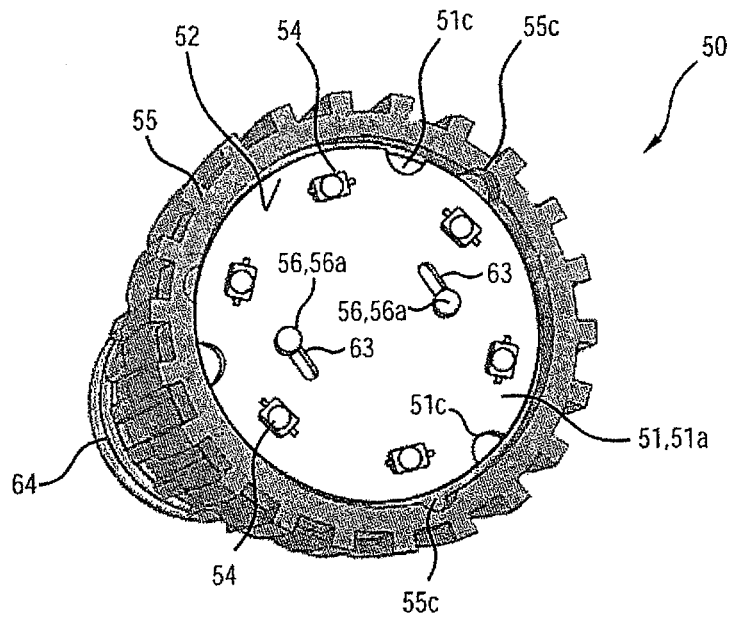
FIG. 17 shows, in a view obliquely from the front, the lighting device according to the invention in an assembled, but not yet secured, state.

FIG. 17 shows, in a view obliquely from the front, the lamp 50, in which, in the plugged-in state shown, the securing pins 56 are plugged through the eye regions 63a of the keyholes 63, to be precise such that the laterally widened end regions of heads 56a of the securing pins 56 do not completely look out over the substrate 51a of the printed circuit board.

Figure 18:
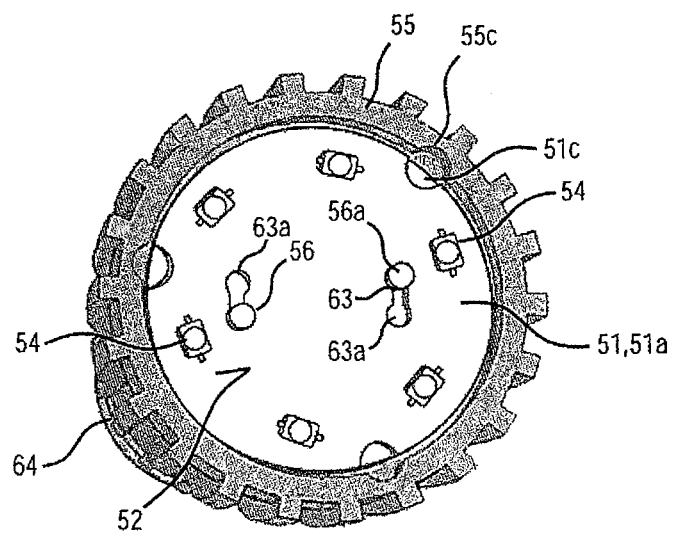
FIG. 18 shows, in a view obliquely from the front, the lighting device according to the invention in the secured state.

To undergo transition from the mated state shown in FIG. 17 to the secured state of the lamp 50 as shown in FIG. 18, the printed circuit board 51 can, in particular, be pressed slightly downward in order to bring the laterally widened head 56a of the securing pins 56 to a position above the substrate 51a. This is made possible by virtue of the fact that the intermediate layer 59 is embodied elastically or resiliently and is selected with a sufficient height.

Afterward, the printed circuit board 51 can be rotated relative to the securing pins 56, here: in the clockwise direction, such that the securing pins 56 slide into the web region 63b of the keyholes. The heads 56a become situated on the respective soldering region 51d in the process. The soldering region therefore serves as a securing region.

Once the printed circuit board 51 is then no longer pressed in the direction of the intermediate layer 59, the intermediate layer 59 forces the printed circuit board 51 slightly against the heads 56a of the securing pins 56. With respect to the longitudinal orientation L, the securing pins 56 engage into the keyholes 63 such that the printed circuit board 51 is held by the securing pins 56 in a force-locking and positively locking manner. Furthermore, good heat dissipation of the waste heat generated by the light emitting diodes 54 to the heat sink 55 is made possible by means of the intermediate layer 59 having a good thermal conductivity.

In the secured state shown in FIG. 18, the recesses 55c of the heat sink 55 and 51c of the printed circuit board 51 also become laterally congruent with one another and thereby form a local receptacle space for the widening regions 57a of the fixing ring 57.

In a subsequent optional soldering step, by means of at least local heating of the printed circuit board 51 and/or of the head 56a of the securing pin 56, the soldering material or solder situated in the soldering region 51d can be caused to melt, such that it cohesively connects the printed circuit board 51 and at least an underside of the head 56a to one another via a soldering connection. This results in a reliable electrical contact between the securing pin 56 and a conductor track structure electrically connected to the respective soldering region 51d, or adjacent thereto, and thus the light emitting diodes 54.

Alternatively, the soldering material situated in the soldering region 51d can be used without soldering for making possible a large-area and highly electrically conductive contact, in particular press contact, with the head 56a of the securing pin 56.

The soldering region 51d of the printed circuit board 51 can be connected to the conductor track structure or constitute a part thereof.

In another alternative embodiment, the securing pins 56 are not electrically connected to the conductor track structure via the keyholes 63. Rather, the securing pins 56 can be connected for example via a wire to the conductor track structure or directly to at least one of the light emitting diodes 54, that is to say e.g. by "wire bonding".

Figure 19:
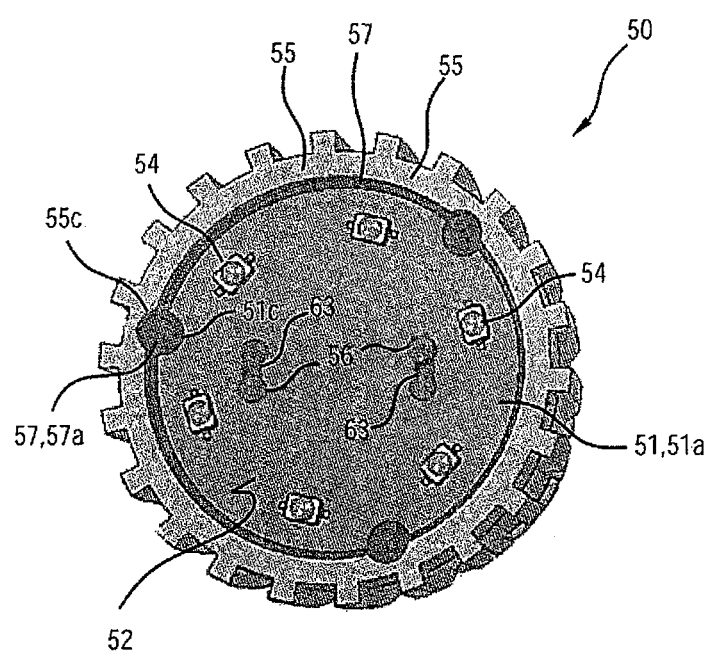
FIG. 19 shows, in a view obliquely from the front, the lighting device according to the invention in a fixed state.

FIG. 19 shows the lamp 50 in a fully assembled and fixed state, wherein now the fixing ring has been inserted between the printed circuit board 51 and the heat sink 55, to be precise by its widening regions 57a into the respective receptacle space created by the recesses 51c and 55c.

In yet another step, a light-transmissive, e.g. milky white bulb can then be placed onto the lamp 50, said bulb curving above the printed circuit board 51.

The printed circuit board 51 overall bears indirectly via the intermediate layer 59 and the heat sink 55 on the end face 60a of the driver housing 60 serving as a support area.

It goes without saying that the present invention is not restricted to the exemplary embodiments shown.

Thus, the printed circuit board, in addition to the circular or disk-shaped basic form, can also have any other basic form, e.g. angular or with a freeform side contour.

Moreover, the cover may or may not be present. If the cover is present or the printed circuit board has a luminous module which has the printed circuit board and advantageously at least the cover, the cover can wholly or partly cover the printed circuit board. The cover may then be at least partly light-transmissive. The cover can be constructed in one piece or in a multipartite fashion.

The printed circuit board 1 and the support 11 just like the printed circuit board 51 and the driver housing 60 can constitute part of a lamp. The lamp can have as constituent parts, inter alia, a driver housing (alternatively a driver cavity is present in the heat sink) and/or a base (e.g. a screw base or a plug base, etc.).

The semiconductor light sources can generally be operated e.g. with a power supply voltage or a converted, in particular lower, voltage.

The support, too, can be any suitable object and is not restricted to a specific basic form. Thus, in addition to a dedicated heat sink, the support can also be a driver housing or some other housing of a lamp. The support can also be a luminaire or a part of a luminaire system.

Furthermore, hooks, lugs, etc. can also be used instead of pins.

The number of securing elements is not restricted and can e.g. also comprise only one securing element, e.g. in a central position of the printed circuit board.

The support can comprise more mating securing elements than the printed circuit board has securing elements. Thus, the support can also be used for a plurality of types of printed circuit boards or arrangements (number and/or position) of securing elements.

Furthermore, the pins (or other projecting elements) and the cutouts may also be interchanged with respect to the printed circuit board and the support. Thus, the support may have the pins, etc., while the printed circuit board can have the keyholes, etc. Mixed forms are also possible, such that both the support and the printed circuit board can have both the pins, etc. and matching keyholes, etc.

Moreover, the cutout (as securing element or mating securing element) itself may not be electrically conductive and may act "only" as a through-conduction element for conducting through or leading through the complementary mating securing element or securing element.

Generally, the expressions "securing element" and "mating securing element" can be mutually interchanged.

The invention claimed is:

1. An assembly comprising a printed circuit board, a support, at least one first securing element on the printed circuit board, and at least one second securing element on the support, wherein the at least one first securing element is configured to mate with the at least one second securing element for securing the printed circuit board to the support, wherein the printed circuit board comprises a front side, for population with at least one semiconductor light source, and a rear side, wherein the at least one first securing element is accessible via the rear side, and wherein the at least one first securing element is formed as an electrical through-conduction element for the at least one semiconductor light source, wherein the support includes a support area for emplacing the printed circuit board, wherein the at least one second securing element is arranged on the support area, and wherein the at least one second securing element is formed as an electrical through-conduction element, and wherein one of (i) the at least one first securing element and (ii) the at least one first securing element is a cutout in the shape of a keyhole, and a soldering region is at the end of the narrow portion of the keyhole and positioned to be engageable by the other of the first and second securing elements.

2. The assembly as claimed in claim 1, wherein the at least one first securing element is formed as an electrically conductive securing element and led through the printed circuit board.

3. The assembly as claimed in claim 1, wherein the printed circuit board includes a plurality of first securing elements arranged symmetrically with respect to an axis of symmetry of the printed circuit board.

4. The assembly as claimed in claim 1, wherein the printed circuit board includes a plurality of first securing elements configured in a coded manner and arranged in the coded manner.

5. The assembly as claimed in claim 1, wherein the at least one first securing element comprises at least one electrically conductive securing pin projecting from the rear side.

6. The assembly as claimed in claim 1, wherein the at least one first securing element is formed as a keyhole.

7. The assembly as claimed in claim 1, wherein the at least one second securing element is electrically conductive and is connected to at least one electrical supply.

8. The assembly as claimed in claim 1, wherein the at least one second securing element is formed as the keyhole for receiving the first securing element of the printed circuit board, wherein the first securing element is electrically conductive and projects from the rear side of the printed circuit board.

9. The assembly as claimed in claim 8, wherein the at least one second securing element is formed as a keyhole.

10. The assembly as claimed in claim 1, wherein the at least one second securing element includes a latching means for releasably latching an inserted first securing element.

11. The assembly as claimed in claim 1, wherein the support forms part of a heat sink.

12. The assembly for a printed circuit board as claimed in claim 1, wherein the support includes at least one support area for at least indirectly emplacing the printed circuit board, wherein at least one second securing element for respectively securing a first securing element of the printed circuit board is arranged on the at least one support area, and wherein the at least one second securing element is electrically conductive and functionally connected to at least one electrical supply.

13. The assembly as claimed in claim 12, wherein the at least one second securing element comprises at least one electrically conductive securing pin projecting from the support area.

14. The assembly as claimed in claim 12, wherein the support is a driver housing.

15. The assembly as claimed in claim 1, wherein a thermally conductive layer is introduced between the printed circuit board and the support, and wherein the thermally conductive layer includes at least one cutout for at least one of leading through the first securing element and leading through the second securing element.

16. The assembly as claimed in claim 1, wherein a heat sink is introduced between the printed circuit board and the support, and wherein the heat sink includes at least one cutout for at least one of leading through the first securing element and leading through the second securing element.

17. The assembly as claimed in claim 16, wherein the heat sink is at least partly plugged over the support.

18. The assembly as claimed in claim 1, wherein the printed circuit board is arranged on a receptacle of the heat sink.

19. The assembly as claimed in claim 1, comprising at least one fixing element for fixing a position of the printed circuit board.

20. A method for securing the printed circuit board to the support in the assembly as claimed in claim 1, wherein the at least one second securing element is arranged on the support area, and wherein the at least one first securing element of the printed circuit board is inserted by a plugging movement or a plugging/rotating movement into a matching second securing element of the support in at least one of a force-locking manner and a positively locking manner.

21. A method for securing the printed circuit board populated with at least one semiconductor light source to the support in the assembly as claimed in claim 1, the method comprising the steps of:
    plugging a heat sink onto the support such that the at least one electrically conductive securing pin which projects from the support and which is connected to an electrical supply projects through the heat sink;
    placing the printed circuit board onto the heat sink such that the at least one securing pin projecting through the heat sink projects at least partly into an associated keyhole of the printed circuit board;
    securing the at least one securing pin in the associated keyhole, such that at least one securing pin is electrically connected to at least one semiconductor light source; and
    fixing a relative rotational position between the support and the printed circuit board via a fixing element comprising a plurality of widening regions arranged angularly on the fixing element and which engage into lateral recesses of the printed circuit board.

22. The method as claimed in claim 21, wherein securing the at least one securing pin in the associated keyhole is performed via a rotating movement between the support and the printed circuit board.

23. The assembly as claimed in claim 1, wherein the system comprises a-lamp.

24. The assembly as claimed in claim 1, further comprising a lamp.

* * * * *